(12) United States Patent
Thees et al.

(10) Patent No.: US 11,195,942 B2
(45) Date of Patent: Dec. 7, 2021

(54) SEMICONDUCTOR DEVICE INCLUDING ELECTRODE TRENCH STRUCTURE AND ISOLATION TRENCH STRUCTURE AND MANUFACTURING METHOD THEREFORE

(71) Applicant: Infineon Technologies AG, Neubiberg (DE)

(72) Inventors: Hans-Juergen Thees, Dresden (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 16/821,429

(22) Filed: Mar. 17, 2020

(65) Prior Publication Data

US 2020/0303528 A1    Sep. 24, 2020

(30) Foreign Application Priority Data

Mar. 20, 2019    (DE) .......................... 102019107151.8

(51) Int. Cl.
| | |
|---|---|
| *H01L 29/739* | (2006.01) |
| *H01L 29/08* | (2006.01) |
| *H01L 29/66* | (2006.01) |
| *H01L 29/06* | (2006.01) |
| *H01L 21/762* | (2006.01) |

(52) U.S. Cl.
CPC .... *H01L 29/7397* (2013.01); *H01L 21/76224* (2013.01); *H01L 29/0615* (2013.01); *H01L 29/0847* (2013.01); *H01L 29/66348* (2013.01)

(58) Field of Classification Search
CPC ........... H01L 21/76224; H01L 29/7397; H01L 29/0615; H01L 29/0847; H01L 29/66348

USPC .......................................................... 257/330
See application file for complete search history.

(56) References Cited

U.S. PATENT DOCUMENTS

| | | | |
|---|---|---|---|
| 9,899,477 B2 | 2/2018 | Turner et al. | |
| 2007/0080422 A1 | 4/2007 | Falck et al. | |
| 2013/0069109 A1 | 3/2013 | Matsuda et al. | |
| 2014/0264567 A1* | 9/2014 | Challa | H01L 29/0653 257/330 |
| 2014/0319540 A1* | 10/2014 | Sugimoto | H01L 29/0653 257/77 |

(Continued)

FOREIGN PATENT DOCUMENTS

| | | |
|---|---|---|
| DE | 102014111219 A1 | 4/2015 |
| DE | 102014117364 A1 | 5/2015 |

(Continued)

*Primary Examiner* — Igwe U Anya
(74) *Attorney, Agent, or Firm* — Murphy, Bilak & Homiller, PLLC

(57) ABSTRACT

An embodiment of a semiconductor device includes a semiconductor mesa in an active device area. The semiconductor mesa includes source regions arranged along a longitudinal direction of the semiconductor mesa and separated from one another along the longitudinal direction. The semiconductor device further includes an electrode trench structure including a dielectric and an electrode. The electrode trench structure adjoins a side of the semiconductor mesa. The semiconductor device further includes an isolation trench structure filled with one or more insulating materials. The isolation trench structure extends through the semiconductor mesa and into or through the electrode trench structure along a first lateral direction.

22 Claims, 10 Drawing Sheets

(56) References Cited

U.S. PATENT DOCUMENTS

2015/0179750 A1\* 6/2015 Calafut ............ H01L 29/42368
438/270
2018/0145161 A1\* 5/2018 Baburske .............. H01L 29/407
2018/0342605 A1\* 11/2018 Dainese ................ H01L 29/407

FOREIGN PATENT DOCUMENTS

| DE | 102015107319 A1 | 11/2015 |
| DE | 102015107331 A1 | 11/2015 |
| DE | 102015121100 A1 | 6/2017 |
| DE | 102018112344 A1 | 11/2018 |

\* cited by examiner

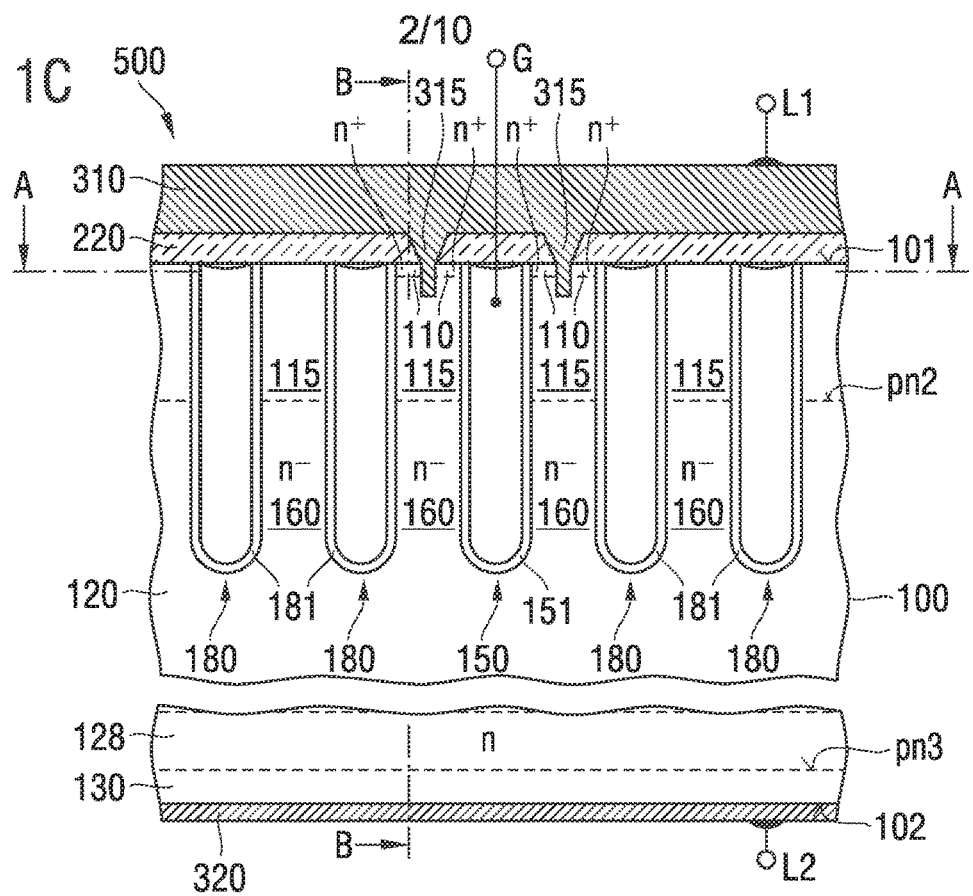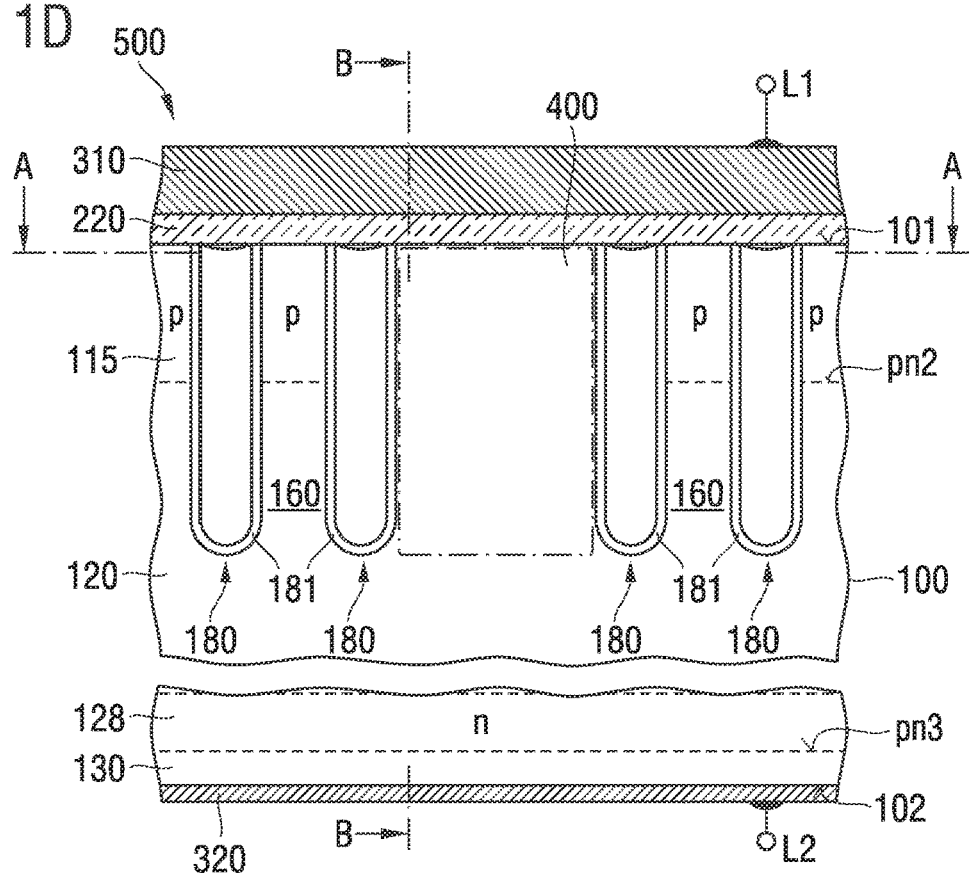

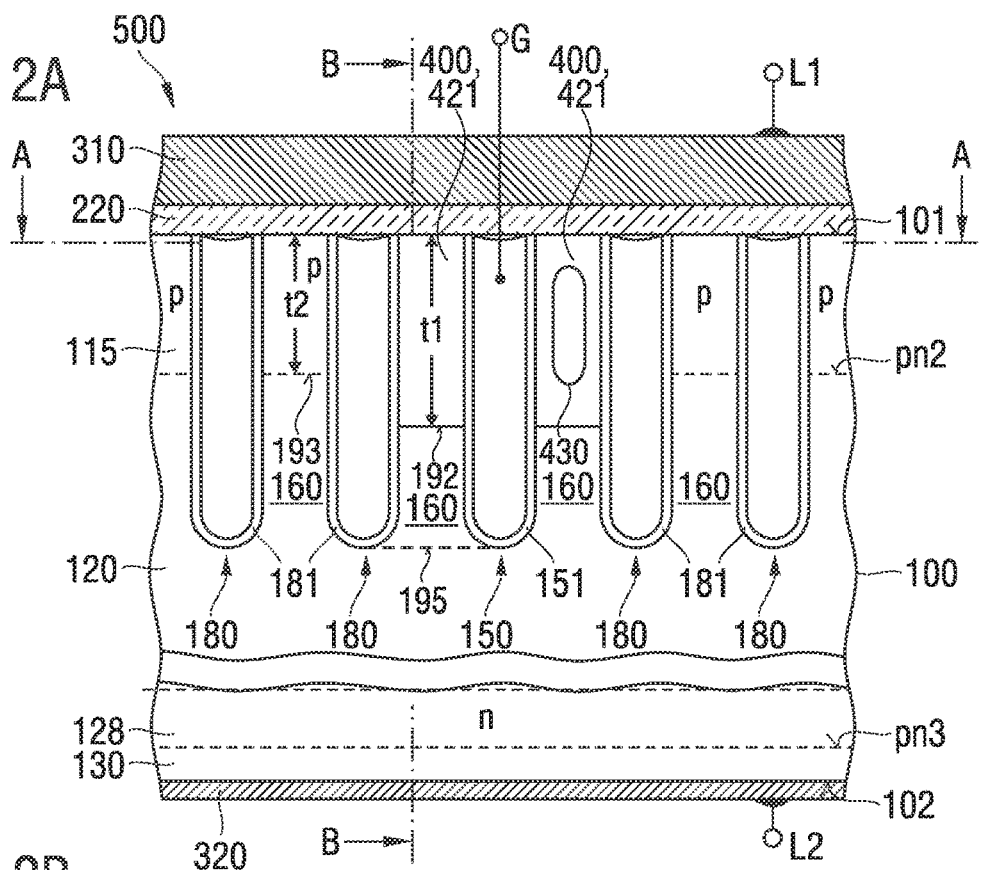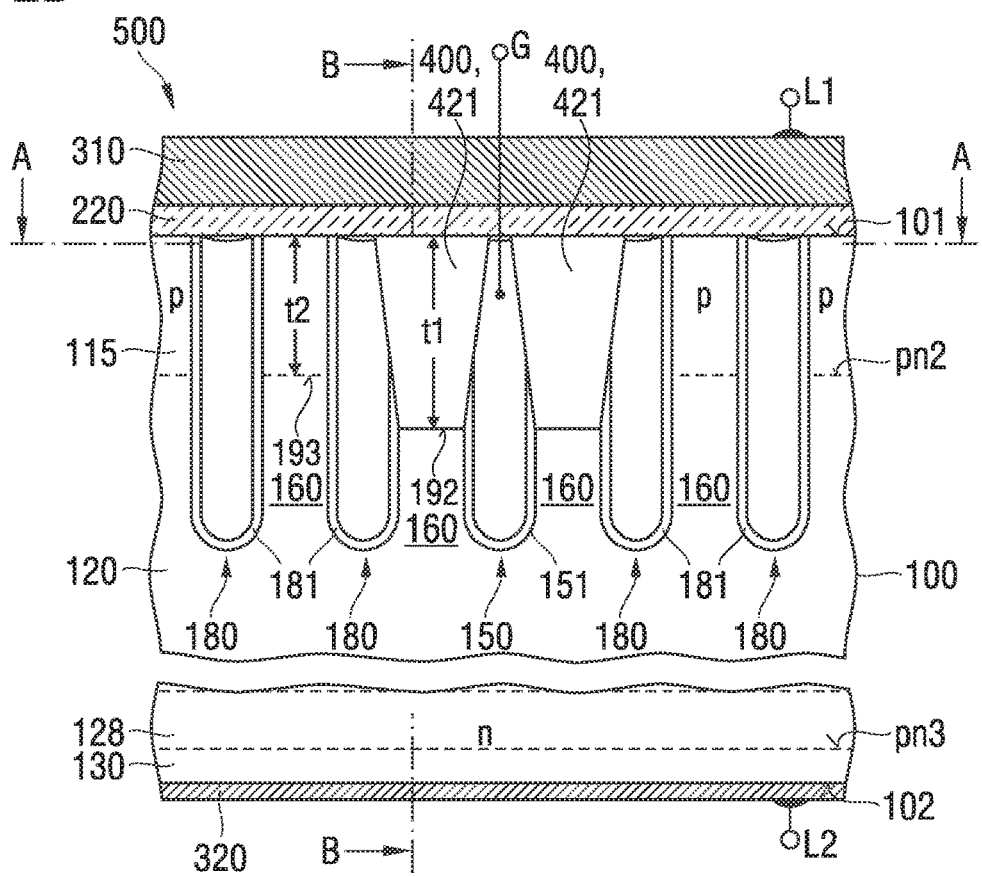

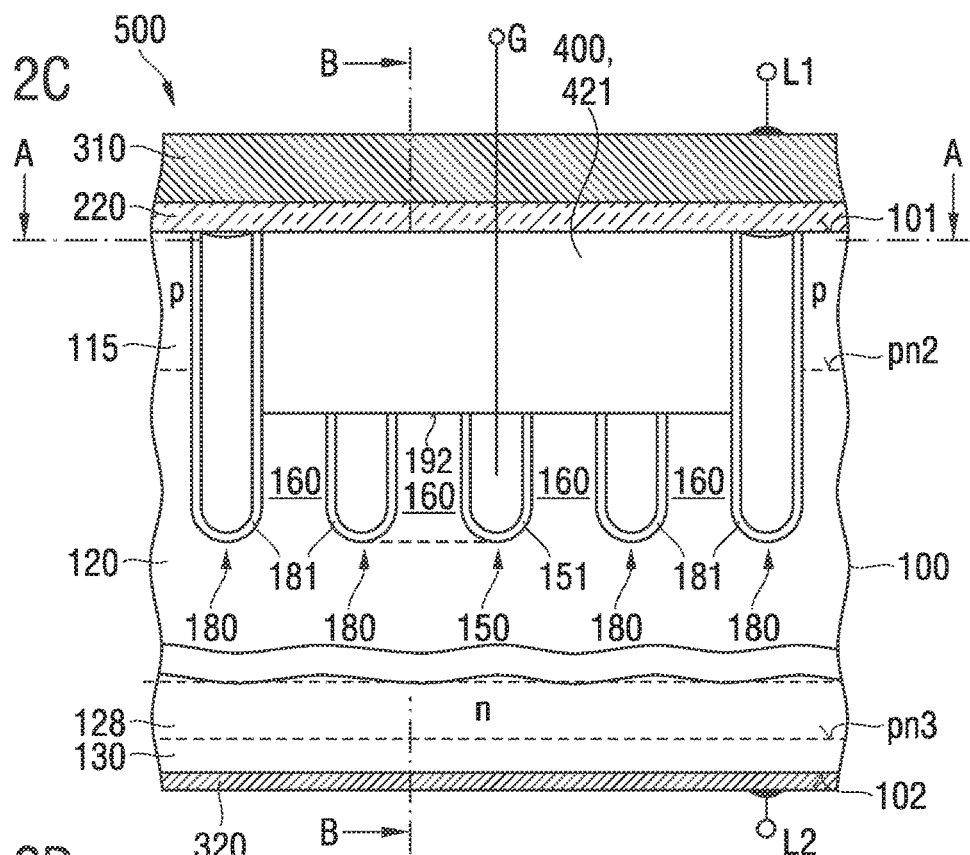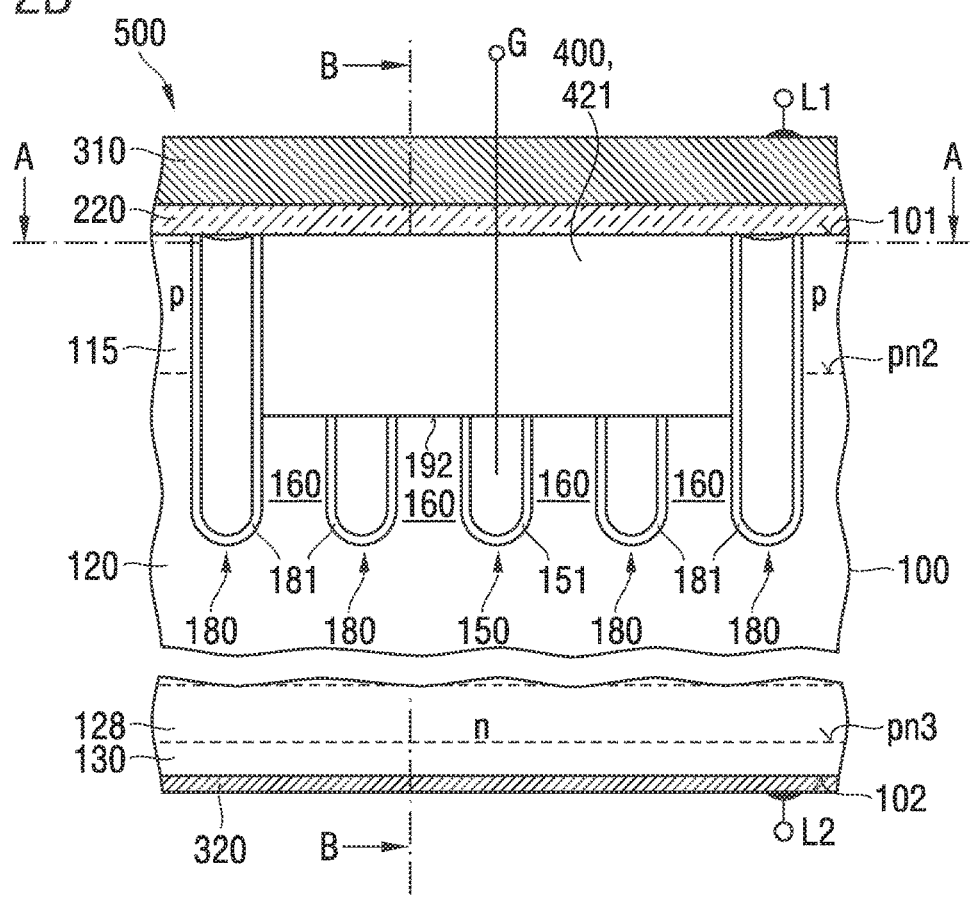

SEMICONDUCTOR DEVICE INCLUDING ELECTRODE TRENCH STRUCTURE AND ISOLATION TRENCH STRUCTURE AND MANUFACTURING METHOD THEREFORE

TECHNICAL FIELD

Examples of the present disclosure relate to semiconductor devices, in particular, to power semiconductor devices with electrode trench structures and isolation trench structures and to methods of manufacturing semiconductor devices.

BACKGROUND

In semiconductor switching devices like IGBTs (insulated gate bipolar transistors) as well as RC-IGBTs (reverse conducting IGBTs) mobile charge carriers flood a low-doped drift zone and form a charge carrier plasma that provides a low on-state resistance. For achieving high short-circuit robustness, source regions are formed only in portions of the cell area in order to limit the maximum short-circuit current. On the other hand, reducing the source region area may adversely affect the charge carrier plasma in the drift zone. It is desirable to provide semiconductor devices with improved switching characteristics.

SUMMARY

An embodiment of the present disclosure relates to a power semiconductor device including a semiconductor mesa in an active device area. The semiconductor mesa comprises source regions arranged along a longitudinal direction of the semiconductor mesa and separated from one another along the longitudinal direction. The semiconductor device further includes an electrode trench structure comprising a dielectric and an electrode. The electrode trench structure adjoins a side of the semiconductor mesa. The semiconductor device further includes an isolation trench structure filled with one or more insulating materials. The isolation trench structure extends through the semiconductor mesa and into or through the electrode trench structure along a first lateral direction.

Another embodiment of the present disclosure relates to another power semiconductor device including a semiconductor mesa in an active device area. The semiconductor mesa comprises source regions arranged along a longitudinal direction of the semiconductor mesa and separated from one another along the longitudinal direction. The semiconductor device further includes an electrode trench structure comprising a dielectric and an electrode. The electrode trench structure adjoins a side of the semiconductor mesa. The semiconductor device further includes an isolation trench structure filled with one or more insulating materials. The isolation trench structure extends through the semiconductor mesa along a first lateral direction. The semiconductor further includes a second isolation trench structure filled with one or more insulating materials. The second isolation trench structure is arranged in a termination edge area, and the active device area is laterally surrounded by the termination edge area.

Another embodiment of the present disclosure relates to a method of manufacturing a power semiconductor device. The method comprises forming a semiconductor mesa in an active device area. The method further comprises forming an electrode trench structure including a dielectric and an electrode. The electrode trench structure adjoins a side of the semiconductor mesa. The method further comprises forming an isolation trench structure comprising one or more insulating materials. The isolation trench structure extends through the semiconductor mesa and into or through the electrode trench structure along a first lateral direction. The method further comprises forming source regions arranged along a longitudinal direction of the semiconductor mesa and separated from one another along the longitudinal direction.

Another embodiment of the present disclosure relates to another method of manufacturing a power semiconductor device. The method comprises forming a semiconductor mesa in an active device area. The method further comprises forming an electrode trench structure comprising a dielectric and an electrode. The electrode trench structure adjoins a side of the semiconductor mesa. The method further comprises forming an isolation trench structure filled with one or more insulating materials. The isolation trench structure extends through the semiconductor mesa along a first lateral direction. The method further comprises forming a second isolation trench structure filled with one or more insulating materials, wherein the second isolation trench structure is arranged in a termination edge area, and the active device area is laterally surrounded by the termination edge area. The method further comprises forming source regions arranged along a longitudinal direction of the semiconductor mesa and separated from one another along the longitudinal direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a method of manufacturing a semiconductor device and together with the description serve to explain principles of the embodiments. Further embodiments are described in the following detailed description and the claims.

FIG. 1C is a schematic cross-sectional view of the semiconductor device portion of FIG. 1A along line C-C.

FIG. 1D is a schematic cross-sectional view of the semiconductor device portion of FIG. 1A along line D-D.

FIG. 2A is a schematic cross-sectional view of the semiconductor device portion of FIG. 1A along line D-D in accordance with an embodiment including an isolation trench structure between opposite electrode trench structures.

FIG. 2B is a schematic cross-sectional view of the semiconductor device portion of FIG. 1A along line D-D in accordance with an embodiment including an isolation trench structure extending through a semiconductor mesa and into electrode trench structures.

FIG. 2C and FIG. 2D are schematic cross-sectional views of the semiconductor device portion of FIG. 1A along line D-D in accordance with embodiments including an isolation trench structure extending through semiconductor mesas and through electrode trench structures.

DETAILED DESCRIPTION

Figure 1A:
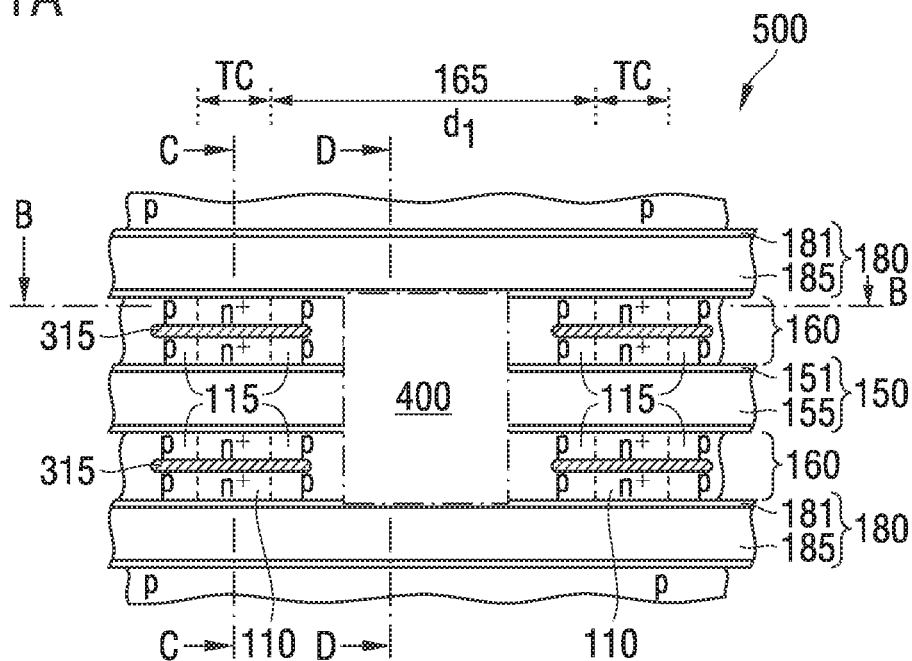
FIG. 1A is a schematic plan view of a portion of a semiconductor device with a separation region between neighboring source regions in accordance with an embodiment.
Figure 1B:
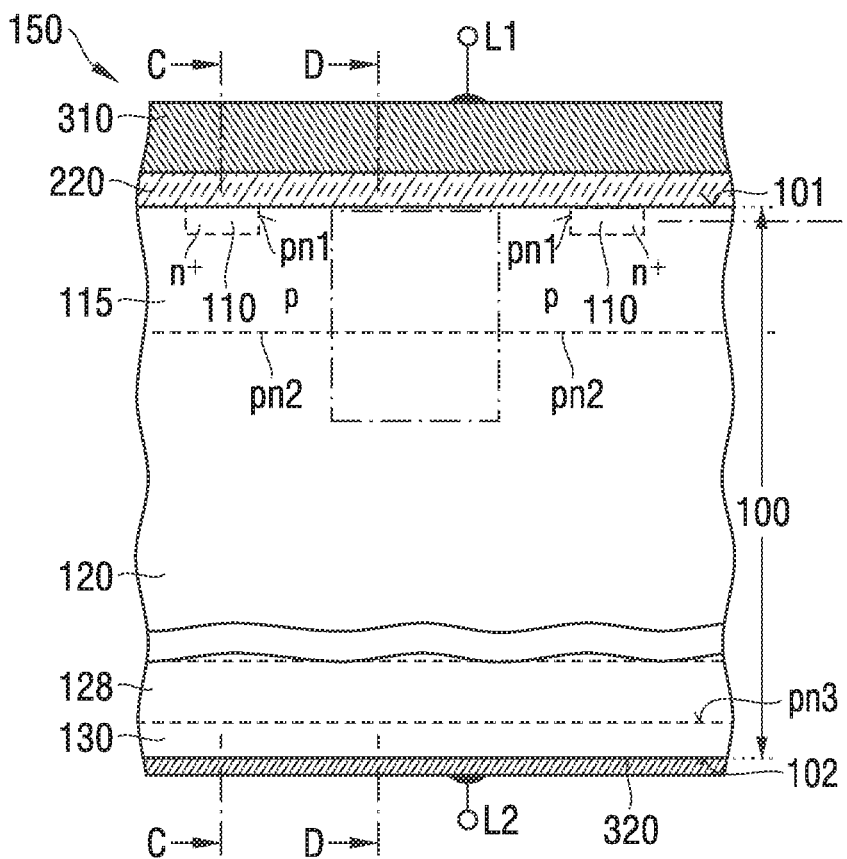
FIG. 1B is a schematic cross-sectional view of the semiconductor device portion of FIG. 1A along line B-B.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. A parameter y with a value of at least c reads as c≤y and a parameter y with a value of at most d reads as y≤d.

According to an embodiment, a semiconductor device may include a semiconductor mesa in an active device area. The semiconductor mesa may comprise source regions arranged along a longitudinal direction of the semiconductor mesa and separated from one another along the longitudinal direction. The semiconductor device may further include an electrode trench structure comprising a dielectric and an electrode. The electrode trench structure may adjoin a side of the semiconductor mesa. The semiconductor device may further include an isolation trench structure filled with one or more insulating materials. The isolation trench structure may extend through the semiconductor mesa and into or through the electrode trench structure along a first lateral direction.

The semiconductor device may be a semiconductor diode, an IGBT (insulated gate bipolar transistor), or an RC IGBT (reverse conducting IGBT), for example. The semiconductor device may be a power semiconductor device. A power semiconductor device may be a semiconductor device configured to block high voltages and/or conduct or switch high currents, e.g. voltages greater than 15V, or greater than 100V, or greater than 400V, or even greater than 1000V, or currents greater than 100 mA, or greater than 1 A, or even greater than 10 A or 100 A. A power semiconductor device is thus different from e.g. a transistor in a memory circuit block or digital circuit block, for example. The power semiconductor device may include a plurality, e.g. tens, hundreds or even thousands of transistor cells connected in parallel, for example.

The active device area may be a part of a semiconductor body configured to conduct a load current, e.g. a source to drain current. In other words, the active device area may adjoin a surface part of the semiconductor body where the load current enters or exits the semiconductor body via e.g. a contact structure electrically connected to the active area device area of the semiconductor body. Thus, the active device area is different from other areas of the semiconductor body where load current does not enter or exit through a respective surface part of the semiconductor body. By way of example, the active device area is different from an edge termination area aiming at lowering electric field strengths in a breakdown voltage range of the semiconductor device. The active device area also differs from a kerf region being a safety margin around the outer portion of each die to account for damage when dicing a wafer into individual dies. The active device area may include a plurality of transistor cells. In some embodiments, the semiconductor device is a vertical semiconductor device where a load current is directed along a vertical direction between opposite first and second surfaces of the semiconductor body. This may imply a source electrode electrically connected to the first surface of the semiconductor body and a drain electrode electrically connected to the second surface of the semiconductor body, for example.

The semiconductor mesa is a region that is laterally confined by opposite trench structures. The longitudinal direction of the semiconductor mesa may be an extension direction of the semiconductor mesa along a lateral direction. An extent of the semiconductor mesa along the longitudinal direction may be larger than an extent, e.g. a width of the semiconductor mesa along a lateral direction that is perpendicular to the longitudinal direction. An extent of the semiconductor mesa along the longitudinal direction may also be larger than an extent, e.g. a height of the semiconductor mesa along a vertical direction that is perpendicular to the longitudinal direction and is also perpendicular to the first surface of the semiconductor body.

The semiconductor device may further include an electrode trench structure comprising a dielectric and an electrode. The electrode trench structure may adjoin a side of the semiconductor mesa. The dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. The electrode may include one electrode material or a combination of electrode materials, for example a doped semiconductor material (e.g., a degenerately doped semiconductor material) such as doped polycrystalline silicon, metal or metal compounds. In some embodiments, the electrode may be a gate electrode and the dielectric may be a gate dielectric. The corresponding electrode trench structure may be called gate electrode trench structure or active electrode trench structure. In an active electrode trench structure, a channel current may be controlled by varying a voltage applied to the gate electrode in the active electrode trench structure, for example. The electrode may also be a source electrode electrically connected to the source regions. The corresponding electrode trench structure may be called source electrode trench structure or passive electrode trench structure. Other passive electrode trench structures may be configured as follows. The electrode structure may also be a dummy gate electrode. Although the dummy gate may be electrically connected to the gate or control terminal, the dummy gate may not contribute to control of a channel current in the mesa that adjoins the dummy gate trench structure, because of missing source regions in the mesa that adjoins the dummy gate trench structure (dummy mesa), for example. Alternately, instead of missing source regions, the source regions in a dummy mesa adjacent a dummy gate structure may not be electrically connected to the load terminal. Instead of electrically connecting the electrode to the source regions, the electrode may also be electrically connected to an auxiliary potential or be electrically floating. The electrode trench structure adjoining the opposite sidewalls of the semiconductor mesa may both be active electrode trench structures or passive electrode trench structures or a combination of an active and a passive electrode structure. There may be multiple passive electrode trench structures arranged between two active electrode trench structures of adjacent transistor cells.

The isolation trench structure may include one or more electrically insulating materials, e.g. one or more of silicon oxide, silicon nitride, silicon oxynitride, doped or undoped silicon glass, for example BSG (boron silicate glass), PSG (phosphorus silicate glass), or BPSG (boron phosphorus silicate glass), TEOS (Tetraethylorthosilicate) oxide, by way of example.

The isolation trench structure may extend through at least one semiconductor mesa and into or through at least one electrode trench structure along a first lateral direction. The first lateral direction may be a lateral direction that is different from the longitudinal direction of the semiconductor mesa. Sidewalls of the isolation trench structure may be tapered. Sidewall tapers may be adjusted based on etch process selection, for example. Isotropic and/or anisotropic etch processes and any combinations thereof may be adjusted for setting a desired taper of the sidewalls, for example.

In some other embodiments, the isolation trench structure may extend through the semiconductor mesa and may be confined by opposite electrode trench structures, for example. In other words, the isolation trench structure may not extend into or through the electrode trench structures, for example.

The isolation trench structure may allow for a confinement of charge carriers, e.g. holes in an n-type channel IGBT, thereby enabling an improvement of a collector-emitter saturation voltage Vce(sat) and/or reduction of switch-on losses Eon. The isolation trench structure may further allow for a reduction of a coupling capacitance between two neighboring source regions. The isolation trench structure may also allow for reducing a gate source capacitance Cgs while maintaining a feedback capacitance Cgd, for example.

According to an embodiment, the semiconductor device may further comprise a second isolation trench structure filled with one or more insulating materials. The second isolation trench structure may be arranged in a termination edge area that at least partly surrounds the active device area. In some embodiments, the second isolation trench structure may completely surround the active device area.

According to an embodiment, a semiconductor device may comprise a semiconductor mesa in an active device area. The semiconductor mesa may comprise source regions arranged along a longitudinal direction of the semiconductor mesa and separated from one another along the longitudinal direction. The semiconductor device may further comprise an electrode trench structure comprising a dielectric and an electrode. The electrode trench structure may adjoin a side of the semiconductor mesa. The semiconductor device may further comprise an isolation trench structure filled with one or more insulating materials, wherein the isolation trench structure extends through the semiconductor mesa along a first lateral direction. The semiconductor device may further comprise a second isolation trench structure filled with one or more insulating materials. The second isolation trench structure is arranged in a termination edge area, and the active device area is laterally surrounded by the termination edge area.

The second isolation trench structure may allow for a replacement of LOCOS (local oxidation of silicon) isolation structures in the termination edge area, for example. Thereby, a reduction of manufacturing costs may be achieved as well as more flexibility and controllability of dimensions of an isolation structure in the termination edge area, e.g. due to avoidance of so-called 'birds beak' of LOCOS. The second isolation structure may further allow for smaller electric fields at an interface to an imide, gel or mold compound as well as less contamination/pentode risks.

According to an embodiment of the semiconductor device, a vertical distance between a bottom side of the isolation trench structure and a top surface level of the semiconductor mesa, e.g. a first depth, may be greater than a vertical distance between a bottom side of the second isolation trench structure and the top surface level of the semiconductor mesa, e.g. a second depth. The first and second isolation trench structures may be formed by different photolithographic processes, for example. The first and second depths may be set depending on desired effects of the respective isolation trench structure. The first depth of the isolation trench structure in the active device area may be set in view of charge carrier confinement and the second depth may be set in view of electric field strength reduction in the termination edge area, for example.

According to an embodiment of the semiconductor device, the active device area may be completely laterally surrounded by the second isolation trench structure.

According to an embodiment of the semiconductor device, a vertical distance between a bottom side of the second trench isolation structure and a top surface level of the semiconductor mesa may be in a range from 1 µm to 10 µm or in a range from 2 µm to 5 µm.

According to an embodiment of the semiconductor device, the isolation trench structure may extend into or through the electrode trench structure along the first lateral direction.

According to an embodiment of the semiconductor device, the semiconductor mesa may further comprise a body region, and a vertical level of a bottom side, e.g. a depth of the isolation trench structure may be in a range from a bottom side of the body region to a bottom side of the electrode trench structure. Thereby, charge carrier confinement may be further improved.

According to an embodiment of the semiconductor device, a bottom side section of the isolation trench structure may extend into or through the electrode trench structure, and the bottom side section may adjoin an electrode formed in the electrode trench structure.

According to an embodiment of the semiconductor device, the electrode trench structure may include one or more of a gate electrode adjoining a gate dielectric, an electrically floating electrode and an electrode electrically connected to the source regions.

According to an embodiment of the semiconductor device, the isolation trench structure may further comprise one or more voids. This may allow for a reduction of stress in the semiconductor body, for example.

According to an embodiment of the semiconductor device, the isolation trench structure may be located between two adjacent source regions arranged in the semiconductor mesa. In some embodiments, one or both of opposite source regions may directly adjoin the isolation trench structure. In some other embodiments, a part of the body region may be arranged between each of the opposite source regions and the isolation trench structure, for example.

According to an embodiment of a method of manufacturing a semiconductor device, a semiconductor mesa may be formed in an active device area. An electrode trench structure including a dielectric and an electrode may be formed, wherein the electrode trench structure adjoins a side of the semiconductor mesa. An isolation trench structure comprising with one or more insulating materials may be formed, wherein the isolation trench structure extends through the semiconductor mesa and into or through the electrode trench structure along a first lateral direction. Source regions may be formed and arranged along a longitudinal direction of the semiconductor mesa and separated from one another along the longitudinal direction.

According to an embodiment, the method may further comprise forming a second isolation trench structure filled with one or more insulating materials, wherein the second isolation trench structure is arranged in a termination edge area that at least partly surrounds the active device area.

According to an embodiment of a method of manufacturing a semiconductor device, a semiconductor mesa may be formed in an active device area. An electrode trench structure comprising a dielectric and an electrode may be formed, wherein the electrode trench structure adjoins a side of the semiconductor mesa. An isolation trench structure filled with one or more insulating materials may be formed, wherein the isolation trench structure extends through the semiconductor mesa along a first lateral direction. A second isolation trench structure filled with one or more insulating materials may be formed, wherein the second isolation trench structure is arranged in a termination edge area, and the active device area is laterally surrounded by the termination edge area. Source regions may be formed and arranged along a longitudinal direction of the semiconductor mesa and separated from one another along the longitudinal direction According to an embodiment of the method, the isolation trench structure and the second isolation trench structure may be concurrently formed. Trenches of the isolation trench structure and the second isolation trench structure may be formed by a common photolithographic process, e.g. by one or more common etch processes.

According to an embodiment of the method, the isolation trench structure and the second isolation trench structure may be formed by separate photolithographic processes.

According to an embodiment of the method, at least some of the one or more insulating materials filling the isolation trench and the second isolation trench may be concurrently formed in the isolation trenches. Thus, insulating layer deposition processes may concurrently fill the isolation trenches, for example.

According to an embodiment of the method, forming the second isolation trench structure may include etching a trench into a semiconductor body up to a depth in a range from 2 µm to 5 µm.

According to an embodiment of the method, the isolation trench structure and the second isolation trench structure may be formed after forming the electrode trench structure. In other words, trenches of the isolation trench structure and the second isolation trench structure may be formed after filling gate electrode trenches with a gate dielectric and a gate electrode, for example.

According to an embodiment of the method, forming the isolation trench structure may comprise removing a part of an electrode of the electrode trench structure. Thereby, a transverse conductivity of the electrode in the electrode trench structures may be adjusted, for example. Also, a gate to source capacitance may be reduced, for example.

FIGS. 1A to 1D illustrate a portion of a semiconductor device 500 including a separation region 400 between neighboring source regions 110 assigned to a same semiconductor mesa 160.

The semiconductor device 500 may be a semiconductor diode, for example an MCD (MOS controlled diode), or an IGBT (insulated gate bipolar transistor), or an RC IGBT (reverse conducting insulated gate bipolar transistor). A semiconductor body 100 of the semiconductor device 500 may be formed by a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be defined by a plane spanned by coplanar surface sections, as well as a mainly planar second surface 102 parallel to the first surface 101. A minimum distance between the first and second surfaces 101, 102 depends on the voltage blocking capability specified for the semiconductor device 500. For example, the distance between the first and second surfaces 101, 102 may be in a range from 90 µm to 120 µm for a semiconductor device based on silicon (Si) specified for a blocking voltage of about 1200 V. Other embodiments related to semiconductor devices with larger blocking capabilities may provide semiconductor bodies 100 with a thickness of several 100 μm. For semiconductor devices with lower blocking voltage the thickness may be smaller, e.g. in a range from 35 μm to 90 μm for silicon (Si).

For silicon carbide (SiC), the distance between the first and second surfaces 101, 102 may be around ⅕ to ¹/₁₀ of the value of a silicon device for the same blocking capability, e.g. from 9 μm to 24 μm for a SiC semiconductor device specified for a blocking voltage of about 1200 V.

In a plane parallel to the first surface 101 the semiconductor body 100 may have a rectangular shape with an edge length in the range of one or more millimeters up to one or more centimeters. A normal to the first surface 101 defines a vertical direction and directions orthogonal to the vertical direction are lateral directions.

The semiconductor body 100 includes a drift zone 120 of a first conductivity type and a body region 115 of a second conductivity type. The second conductivity type is opposite to the first conductivity type. The body region 115 is located between the first surface 101 and the drift zone 120. A contact layer 130 may be arranged between the drift zone 120 and the second surface 102.

For the illustrated embodiments the first conductivity type is the n-type and the second conductivity type is the p-type. Similar considerations as outlined below apply to embodiments with the first conductivity type being the p-type and the second conductivity type being the n-type.

An impurity concentration in the drift zone 120 may gradually or in steps increase or decrease with increasing distance to the first surface 101 at least in portions of its vertical extension. According to other embodiments the impurity concentration in the drift zone 120 may be approximately uniform. For IGBTs based on silicon, a mean impurity concentration in the drift zone 120 may be between $5 \times 10^{12}$ (5E12) cm$^{-3}$ and $1 \times 10^{15}$ (1E15) cm$^{-3}$, for example in a range from $1 \times 10^{13}$ (1E13) cm$^{-3}$ to $1 \times 10^{14}$ (1E14) cm$^{-3}$. In the case of a semiconductor device based on SiC, a mean impurity concentration in the drift zone 120 may be between $5 \times 10^{14}$ (5E14) cm$^{-3}$ and $1 \times 10^{17}$ (1E17) cm$^{-3}$, for example in a range from $1 \times 10^{15}$ (1E15) cm$^{-3}$ to $1 \times 10^{16}$ (1E16) cm$^{-3}$.

The contact layer 130 may be adapted to a target configuration of the semiconductor device 500. For an IGBT, the contact layer 130 may include one or more layers of the second conductivity type configured to act as a rear side emitter. A mean impurity concentration for the contact layer 130 may be at least $1 \times 10^{16}$ (1E16) cm$^{-3}$, for example at least $5 \times 10^{17}$ (5E17) cm$^{-3}$. For an RC IGBT, the contact layer 130 may include first zones of the conductivity type of the body regions 115 and second zones of the conductivity type of the drift zone 120. The impurity concentrations in the first and second zones may be set sufficiently high for forming an ohmic contact with a contact electrode, e.g. a metal directly adjoining the second surface 102.

A field stop layer 128 of the first conductivity type may separate the contact layer 130 from the drift zone 120, wherein a mean net impurity concentration in the field stop layer 128 may be lower than the impurity concentration in the contact layer 130 by at least one order of magnitude and may be higher than in the drift zone 120 by at least one order of magnitude, for example.

Electrode trench structures 150, 180 extend from the first surface 101 into the drift zone 120. Portions of the semiconductor body 100 between neighboring electrode trench structures 150, 180 form semiconductor mesas 160.

The electrode trench structures 150, 180 may be stripes extending along an extension direction, i.e. the longitudinal direction of the semiconductor mesas 160. According to an embodiment, the extension direction may be exclusively parallel to the first lateral direction such that the semiconductor mesas 160 and electrode trench structures 150, 180 are straight stripe structures. According to another embodiment, the extension direction alters with respect to the first lateral direction such that the semiconductor mesas 160 and electrode trench structures 150, 180 form staggered or zigzag stripes. The semiconductor mesas 160 may be regularly arranged at a uniform pitch (center-to-center distance) of, for example, 400 nm to 20 μm, for example 800 nm to 2 μm.

Active electrode trench structures 150 may include a gate electrode 155 and a gate dielectric 151 separating the gate electrode 155 from the semiconductor body 100. The gate electrode 155 may be a homogenous structure or may have a layered structure including one or more conductive layers. According to an embodiment the gate electrode 155 may include heavily doped polycrystalline silicon.

The gate dielectric 151 may include a semiconductor oxide, for example thermally grown or deposited silicon oxide, a semiconductor nitride, for example deposited or thermally grown silicon nitride, or a semiconductor oxynitride, for example silicon oxynitride.

Passive electrode trench structures 180 may include a field electrode 185 and a field dielectric 181 separating the field electrode 185 from the semiconductor body 100. The field electrode 185 may be a homogenous structure or may have a layered structure including one or more conductive layers. According to an embodiment, the field electrode 185 may include a heavily doped polycrystalline silicon layer. The field electrode 185 and the gate electrode 155 may have the same configuration and may include the same materials.

The field dielectric 181 may include a semiconductor oxide, for example thermally grown or deposited silicon oxide, a semiconductor nitride, for example deposited or thermally grown silicon nitride, or a semiconductor oxynitride, for example silicon oxynitride. The field and gate dielectrics 151, 181 may have the same configuration and/or may include the same materials.

Active electrode and passive electrode trench structures 150, 180 may alternate in a regular fashion. For example, one single passive electrode trench structure 180 may be arranged between each pair of gate electrode trench structures 150. According to other embodiments, two, three or more passive electrode trench structures 180 may be arranged between each pair of active electrode trench structures 150. The respective arrangement of active and passive electrode trench structures 150, 180 may vary over a lateral direction of the semiconductor body 100. E.g., the number of passive electrode trench structures 180 between each pair of active electrode trench structures 150 may increase or decrease continuously or stepwise with decreasing distance to an edge termination area of the semiconductor body 100. A further embodiment may exclusively include active electrode trench structures 150.

The gate electrodes 155 may be electrically connected to a gate terminal G of the semiconductor device 500. The field electrodes 185 may be electrically connected to an auxiliary terminal of the semiconductor device 500 or may be electrically connected with one of the load electrodes of the semiconductor device 500 or may be electrically floating. For example, the field electrodes 185 may be electrically connected or coupled to the IGBT emitter electrode, i.e. to source regions of the IGBT.

A distance between the first surface 101 and a bottom of the electrode trench structures 150, 180 may range from 1 μm to 30 μm, e.g., from 2 μm to 7 μm. A lateral width of the semiconductor mesas 160 may range from 0.05 μm to 10 μm, e.g., from 0.1 μm to 1 μm.

The body regions 115 are formed in first sections of the semiconductor mesas 160 oriented to the first surface 101 and may directly adjoin to the first surface 101 in sections of each semiconductor mesa 160. A mean net impurity concentration in the body regions 115 may be in the range from $1\times10^{16}$ (1E16) cm$^{-3}$ to $5\times10^{18}$ (5E18) cm$^{-3}$, for example between $1\times10^{17}$ (1E17) cm$^{-3}$ and $5\times10^{17}$ (5E17) cm$^{-3}$. Each body region 115 forms a second pn junction pn2 with the drift zone 120.

First semiconductor mesas 160 adjoining to at least one active electrode trench structure 150 further include source regions 110 forming first pn junctions pn1 with the body region 115. Second semiconductor mesas 160 between passive electrode trench structures 180 may be devoid of any source regions 110.

The source regions 110 may be formed as wells extending from the first surface 101 into the body region 115 and define transistor cells TC arranged at a first distance d1 along the longitudinal axis or longitudinal direction of the respective semiconductor mesa 160.

The first distance d1 between neighboring source regions 110 arranged along the second lateral direction may be in a range from 0.3 μm to 50 μm, for example in a range from 1 μm to 20 μm.

A dielectric structure 220 separates a first load electrode 310 from the first surface 101. The dielectric structure 220 may include one or more dielectric layers, e.g. silicon oxide, silicon nitride, silicon oxynitride, doped or undoped silicon glass, for example BSG (boron silicate glass), PSG (phosphorus silicate glass), or BPSG (boron phosphorus silicate glass), by way of example.

The first load electrode 310 may be an IGBT emitter electrode or may be electrically coupled or connected to a first load terminal L1 which may be the IGBT emitter terminal of the semiconductor device 500.

Contact structures 315 extend through the dielectric structure 220 and may extend into the semiconductor body 100. The contact structures 315 electrically connect the first load electrode 310 with the source regions 110 and the body regions 115. A plurality of spatially separated contact structures 315 may directly adjoin the respective semiconductor mesa 160, wherein at least some of the contact structures 315 may be assigned to the source regions 110. Other embodiments may provide stripe-shaped contact structures 315 that extend along the whole longitudinal extension of the respective semiconductor mesa 160 and directly adjoin the shadowed regions 165.

A second load electrode 320 directly adjoins the second surface 102 and the contact layer 130. The second load electrode 320 may be electrically connected to a second load terminal L2, which may be the IGBT collector terminal.

Each of the first and second load electrodes 310, 320 may include one or more of aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example.

In a separation region 400 between neighboring source regions 110 arranged along the longitudinal direction the capacitive coupling between the semiconductor mesa 160 and the gate electrode 155 is lower than outside of the separation region 400.

In the following, the effect of the separation region 400 is described by reference to an n-channel IGBT with n-type source and drift zones 110, 120 and p-type body regions 115. The same considerations correspondingly apply to p-channel IGBTs.

In an on-state of the semiconductor device 500 a voltage applied to the gate electrodes 155 exceeds a threshold voltage at which an n-type inversion layer is formed through the body regions 115. For a voltage Vce applied between first and second load electrodes 310, 320 exceeding the built-in voltage of the third pn junctions pn3 between the drift zone 120 or the field stop layer 128 and p-type zones of the contact layer 130, the resulting electron flow between the first and second load electrodes 310, 320 forward biases the third pn junctions pn3, wherein holes are injected into the drift zone 120. The resulting high-density charge carrier plasma in the drift zone 120 results in a low collector-to-emitter saturation voltage VCE, sat and in low on-state losses.

By reducing the lateral conductivity along the second pn junction pn2 due to the separation region 400 at least for positive gate voltages, the lateral voltage drop increases faster such that the respective body region 115 starts to inject at a lower current level. As a result, hole confinement can be improved.

Referring to the schematic cross-sectional view of FIG. 2A, in the separation region 400, an embodiment of an isolation trench structure 421 is formed. The isolation trench structure 421 includes one or more insulating materials. In some embodiments, the isolation trench structure may further include one or more voids 430 for stress reduction, for example. The voids 430 may be formed in any of the embodiments of isolation trench structures described or illustrated herein. The isolation trench structure 421 may extend from a sidewall of the active electrode trench structure through the semiconductor mesa 160 to an opposite sidewall of a respective one of the passive electrode trench structure 180. In other words, the isolation trench structure 421 does not extend into the active or passive electrode trench structures 150, 180. A vertical distance or depth t1 between a bottom side 192 of the isolation trench structure 421 and a top surface level of the semiconductor mesa at the first surface 101 is greater than a vertical distance or depth t2 between a bottom side 193 of the body region 115 and the top surface level of the semiconductor mesa 160 at the first surface 101. The vertical level of the bottom side 192 of the isolation trench structure 421 may be in a range from the bottom side 193 of the body region 115 to a bottom side 194 of the active or passive electrode trench structures 150, 180, for example.

Referring to the schematic cross-sectional view of FIG. 2B, in the separation region 400, the isolation trench structure 421 may also extend into the active or passive electrode trench structures 150, 180, thereby allowing for a reduction of a parasitic capacitances as well as a transverse conductivity of the respective electrode in the trench structure.

Referring to the schematic cross-sectional view of FIG. 2C, in the separation region 400, another embodiment of an isolation trench structure 421 is illustrated. The isolation trench structure 421 may extend through at least one of the semiconductor mesas 160 and through at least one of the active or passive electrode trench structures 150, 180. In the schematic illustration of FIG. 2C, the isolation trench structure 421 ends at sidewalls of passive electrode trench structures 180. However, as is schematically illustrated in the schematic cross-sectional view of FIG. 2D, the isolation trench structure 421 may also laterally end in the mesa region 160 or in one of the active or passive electrode trench structures 150, 180. The lateral extension of the isolation trench structure 421 may be adapted to the general requirement of the semiconductor device 500 and may thus depend on specific hole confinement requirements and/or arrangement pattern of active passive electrode trench structures 150, 180, for example.

Figure 3A:
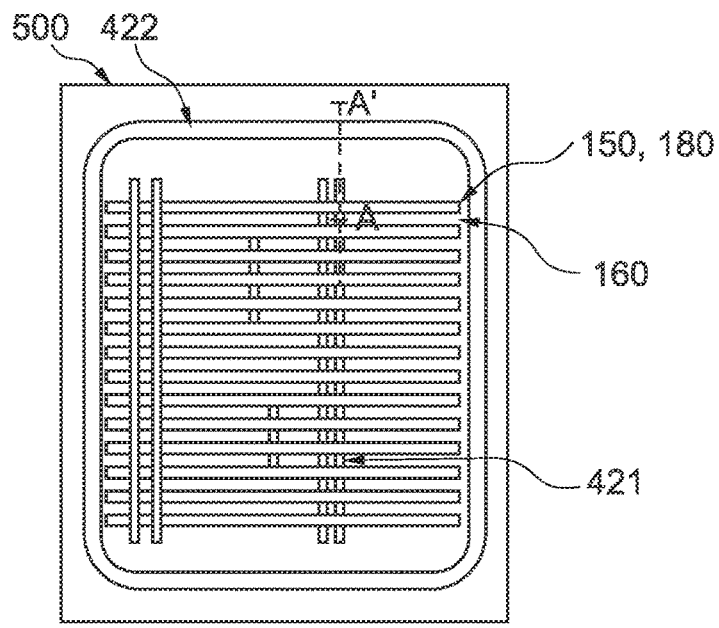
FIG. 3A is a schematic plan view of an IGBT in accordance with an embodiment including isolation trench structures extending through semiconductor mesa regions in a transistor cell array and further including a second isolation trench structure in a termination edge area.

The embodiments illustrated in FIGS. 1A to 2D may be combined in any way, and may further be combined with a second isolation trench structure 422 that is illustrated in the schematic top view of the semiconductor device 500 of FIG. 3A. The second isolation trench structure 422 is arranged outside of the active device area, e.g. in a termination edge area, in a chip periphery, in a gate wiring or gate runner region, and the active device area may be at least partially, e.g. completely laterally surrounded by the second isolation structure 422.

For illustration purposes, the schematic top view of FIG. 3A illustrates combinations of the second isolation trench structure 422 with some of the isolation trench structures 421 described with reference to FIGS. 1A to 2D.

Figure 3B:
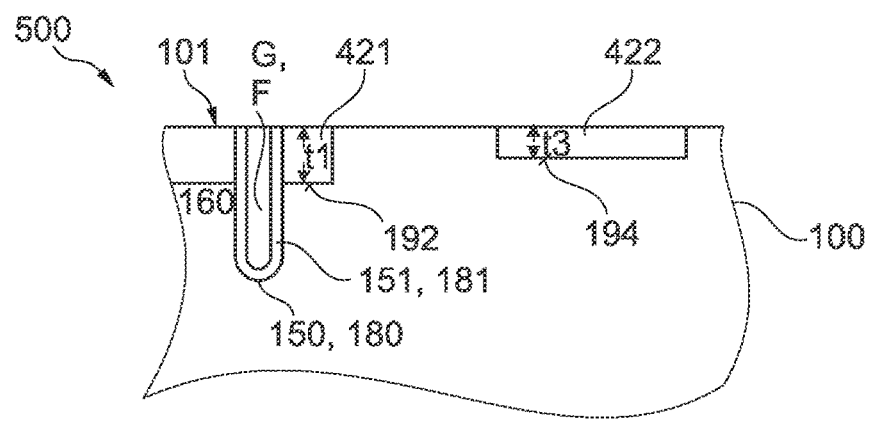
FIGS. 3B and 3C are schematic cross-sectional views view of the semiconductor device portion of FIG. 3A along line A-A of FIG. 3A.

In the embodiment illustrated in the schematic cross-sectional view of FIG. 3B, which is taken along line A-A' of FIG. 3A, the vertical distance t1 between the bottom side 192 of the isolation trench structure 421 and a top surface level of the semiconductor mesa 160 at the first surface 101 is greater than a vertical distance t3 between a bottom side 194 of the second isolation trench structure 422 and the top surface level of the semiconductor mesa at the first surface 101. The isolation trench structures 421, 422 may be formed by separate photolithographic processes that may each be adapted to the functional requirements of the respective isolation trench structure, for example. In some embodiments, a vertical distance between a bottom side of the second trench isolation structure 422 and a top surface level of the semiconductor mesa is in a range from 2 µm to 5 µm.

Figure 3C:
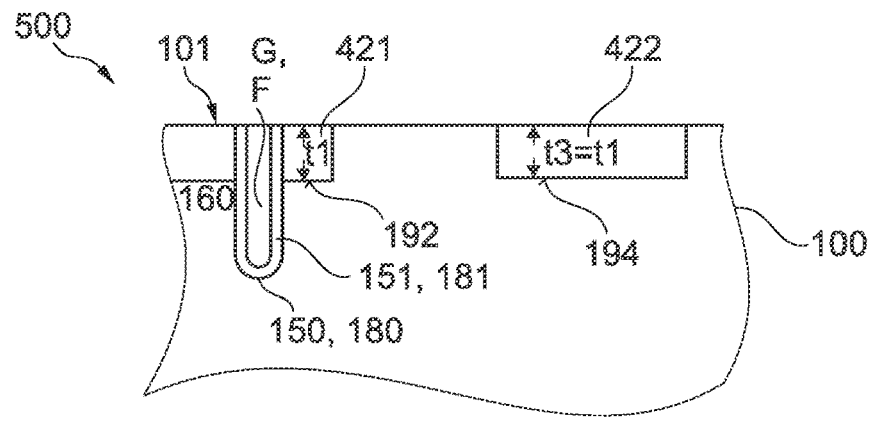

In another embodiment illustrated in the schematic cross-sectional view of FIG. 3C, which is taken along line A-A' of FIG. 3A, the vertical distance t1 between the bottom side 192 of the isolation trench structure 421 and a top surface level of the semiconductor mesa 160 at the first surface 101 is equal to the vertical distance t3 between the bottom side 194 of the second isolation trench structure 422 and the top surface level of the semiconductor mesa at the first surface 101. The isolation trench structures 421, 423 may be concurrently formed by a common photolithographic process, for example.

It will be appreciated that while the exemplary methods described below as a series of steps or events, the described ordering of such steps or events are not to be interpreted in a limiting sense. Rather, some steps may occur in different orders and/or concurrently with other steps or events apart from those described above and below.

The embodiments described above may be combined in any way and will be further illustrated with respect to exemplary figures described below. Conductivity types illustrated in the figures, e.g. n-doped and p-doped, may also be inverted with respect to the illustrated conductivity types.

Functional and structural details described with respect to the embodiments above shall likewise apply to the exemplary figures below.

An embodiment of manufacturing a semiconductor device will be described with reference to the schematic cross-sectional views of FIGS. 4A to 4H.

Figure 4A:
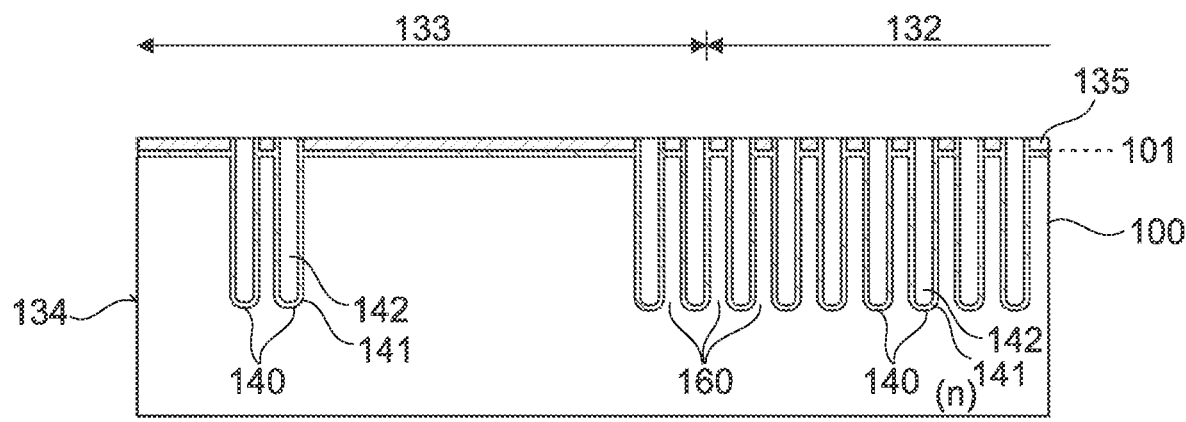
FIGS. 4A to 4H are schematic cross-sectional views for illustrating an embodiment of a method of manufacturing a semiconductor device.

Referring to the schematic cross-sectional view of FIG. 4A, a semiconductor body 100 comprises semiconductor mesas 160 in an active device area 132. Electrode trench structure 140 comprising a dielectric 141 and an electrode 142 extend from a first surface 101 into the semiconductor body 100 in the active device area 132 and in a termination edge area 133. The termination edge area 133 is laterally arranged between the active device area 132 and a side surface 134 of the semiconductor body 100. The electrode trench structures 140 adjoin sides of the semiconductor mesas 160. A mask layer 135 including one or more mask sub-layers, e.g. oxide and/or nitride layers, is arranged on the first surface 101. The electrode trench structures 140 in the termination edge area 133 close to the side surface 134 may be configured as channel stopper structures, for example.

Figure 4B:
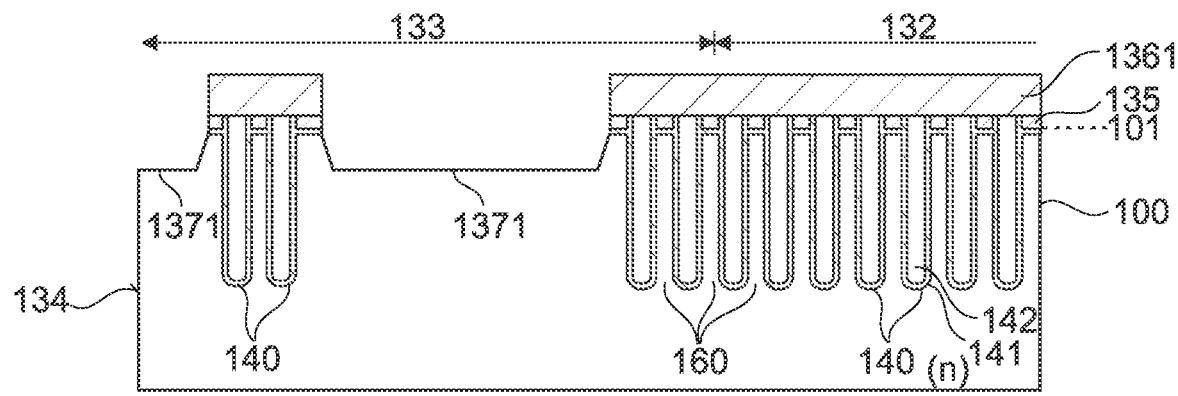

Referring to the schematic cross-sectional view of FIG. 4B, a first resist layer 1361 is formed on the first surface 101 and patterned by photolithography. First trenches 1371 are formed in the termination edge area 133 into the semiconductor body 100 from the first surface 101, e.g. by one or more etch processes.

Figure 4C:
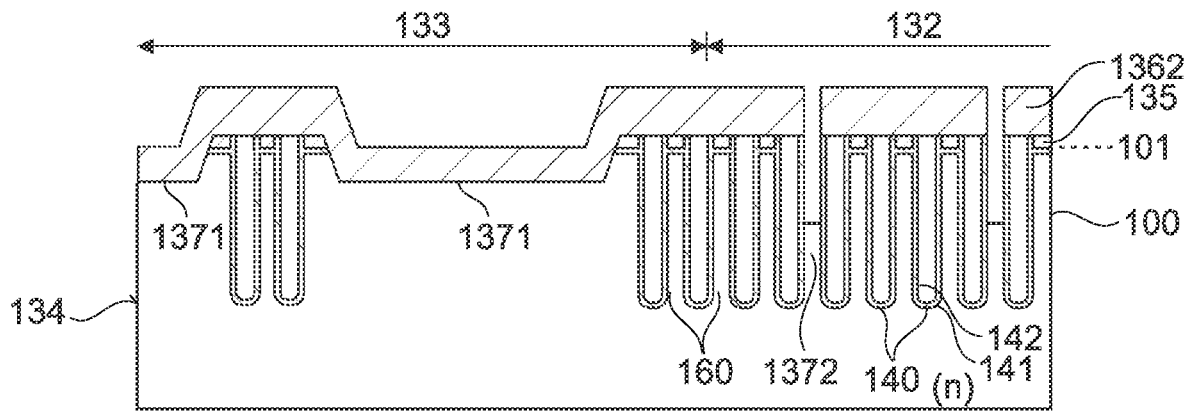

Referring to the schematic cross-sectional view of FIG. 4C, the first resist layer 1361 is removed from the first surface 101. A second resist layer 1362 is formed on the first surface 101 and patterned by photolithography. Second trenches 1372 are formed in the active device area 132 into the semiconductor body 100 from the first surface 101, e.g. by one or more etch processes. The second trenches 1372 laterally extend between opposite ones of the electrode trench structures 140 and may extend deeper into the semiconductor body 100 than the first trenches 1371.

Figure 4D:
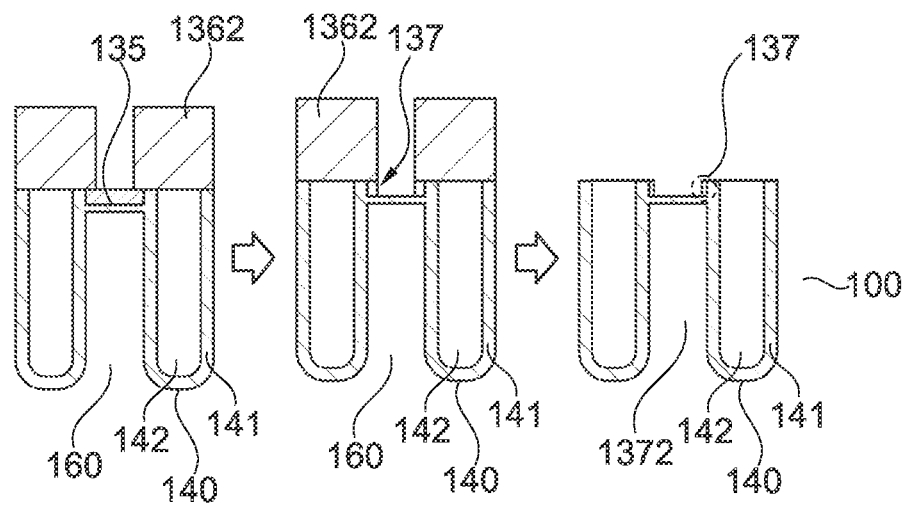

Referring to the schematic cross-sectional view of FIG. 4D, formation of the second trenches 1372 requires etching through the mask layer 135 and into the semiconductor body 100. Depending on the materials used for the mask layer 135 and the semiconductor body 100 and depending on the etch processes used for forming the second trenches 1372, e.g. isotropic and/or anisotropic etch processes, remainders 137 of the mask layer 135 may be adjusted.

Figure 4E:
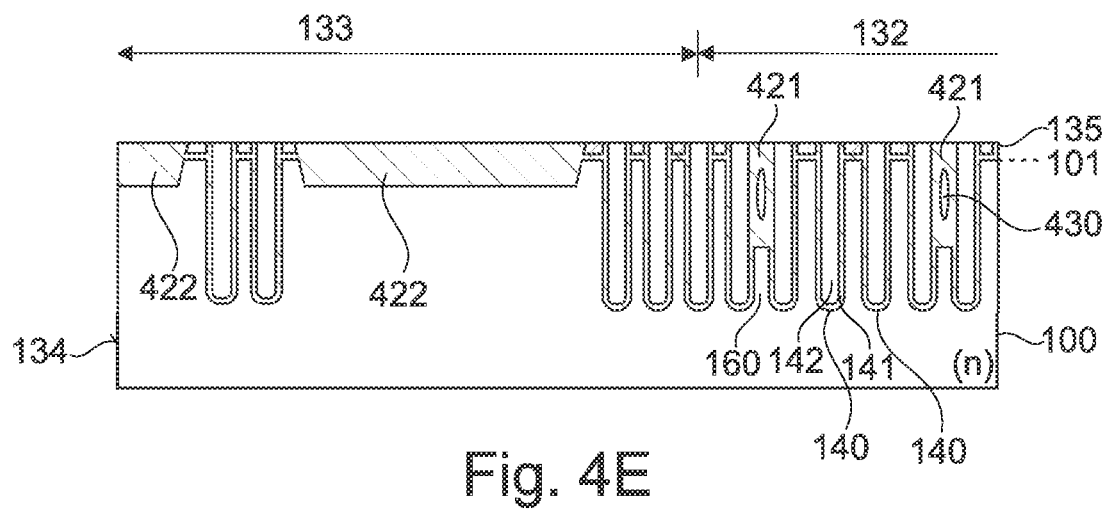

Referring to the schematic cross-sectional view of FIG. 4E, the second resist layer 1362 is removed and first and second isolation trench structures 421, 422 are formed by filling the second and first trenches 1372, 1371 with one or more insulating materials, respectively. Voids 430 may be included in the first and/or second isolation trench structures, if desired, e.g. for stress reduction purposes.

Figure 4F:
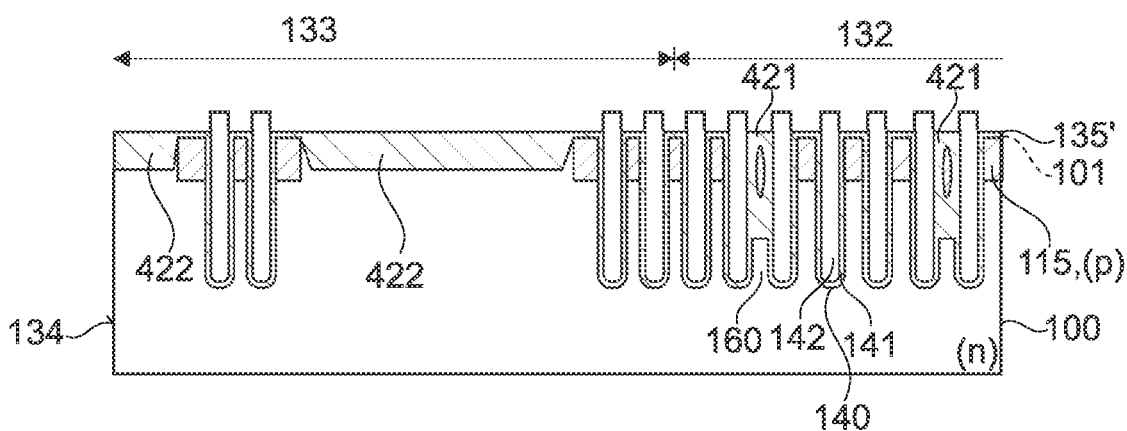

Referring to the schematic cross-sectional view of FIG. 4F, a part of the mask layer 135 is removed, thereby forming a modified mask layer 135'. A body ion implantation process with a subsequent diffusion/activation process may be carried out. Thereby, body regions 115 are formed in the active device area 132.

Figure 4G:
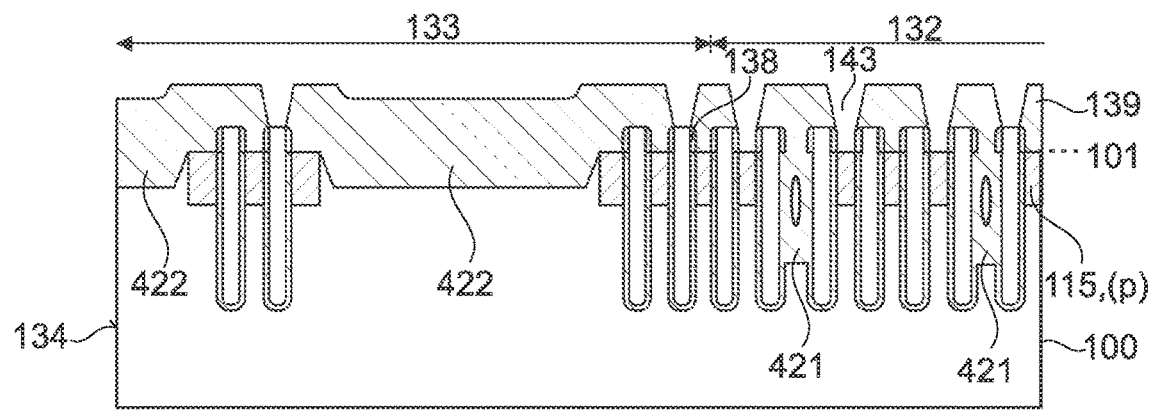

Referring to the schematic cross-sectional view of FIG. 4G, spacers 138 and an intermediate dielectric 139 may be formed on the first surface 101. Contact openings 143 may be formed in the intermediate dielectric 139, e.g. by photolithography. Some of the contact openings 143 may extend up to the body region 115 and some others of the contact openings 143 may extend up to the electrode 142. Thereby, active and passive transistor cells/active and passive electrode trench structures may be defined.

Figure 4H:
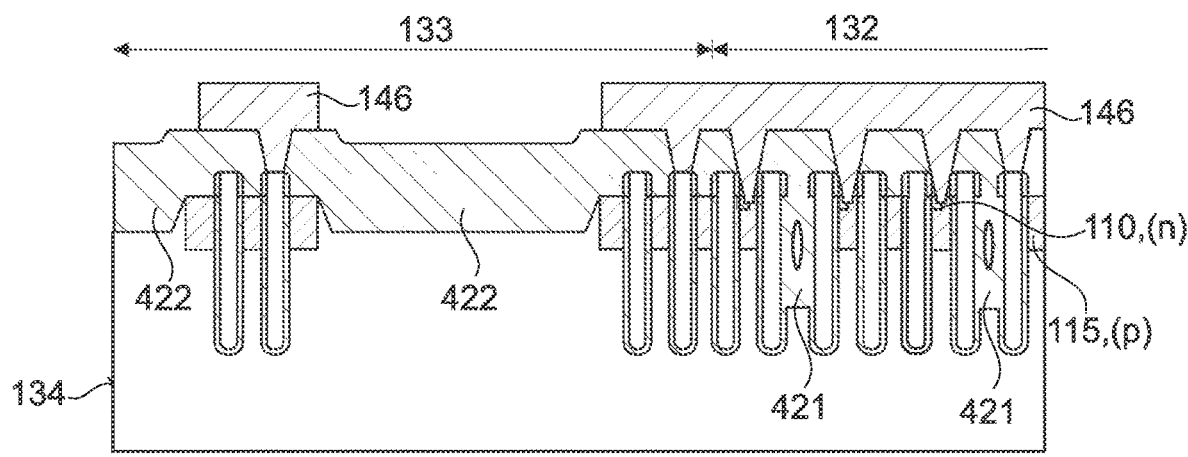

Referring to the schematic cross-sectional view of FIG. 4H, a tilted source ion implantation process with a subsequent diffusion/activation process may be carried out. Thereby, source regions 110 are formed in the active device area 132. A contact electrode 146 is formed on the first surface 101 and patterned, e.g. by photolithography. In some embodiments, the source regions may be formed prior to forming the intermediate dielectric 139.

Further processes, e.g. ion implantations of dopants or layer deposition processes may be carried out apart from those described above and below.

Another embodiment of manufacturing a semiconductor device will be described with reference to the schematic cross-sectional views of FIGS. 5A to 5E.

Figure 5A:
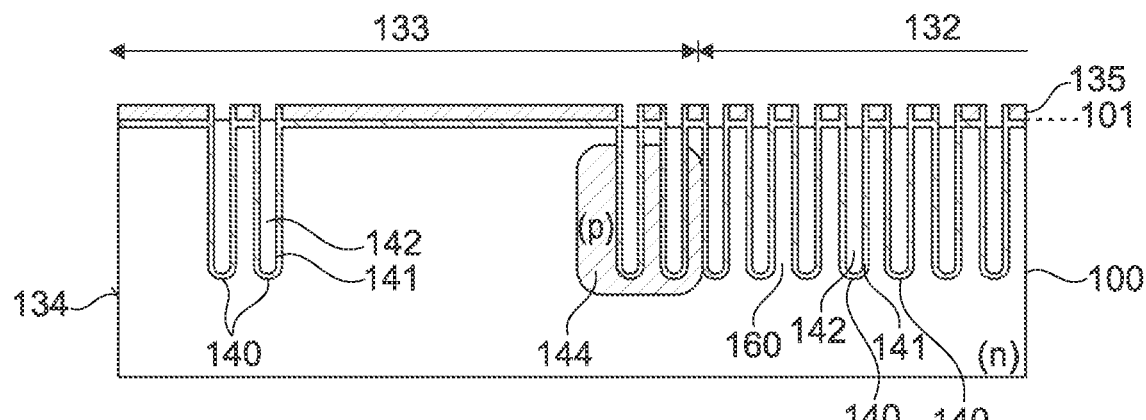
FIGS. 5A to 5E are schematic cross-sectional views for illustrating another embodiment of a method of manufacturing a semiconductor device.

Referring to the schematic cross-sectional view of FIG. 5A, a semiconductor body 100 comprises semiconductor mesas 160 in an active device area 132. Electrode trench structure 140 comprising a dielectric 141 and an electrode 142 extend from a first surface 101 into the semiconductor body 100 in the active device area 132 and in a termination edge area 133. The termination edge area 133 is laterally arranged between the active device area 132 and a side surface 134 of the semiconductor body 100. The electrode trench structures 140 adjoin sides of the semiconductor mesas 160. The semiconductor body 100 may further comprise a p-doped buried region 144 in the termination edge area 133 overlapping with some of the electrode trench structures and surrounding the active device area. A mask layer 135 including one or more mask sub-layers, e.g. oxide and/or nitride layers, is arranged on the first surface 101. The electrode trench structures 140 in the termination edge area 133 close to the side surface 134 may be configured as channel stopper structures, for example.

Figure 5B:
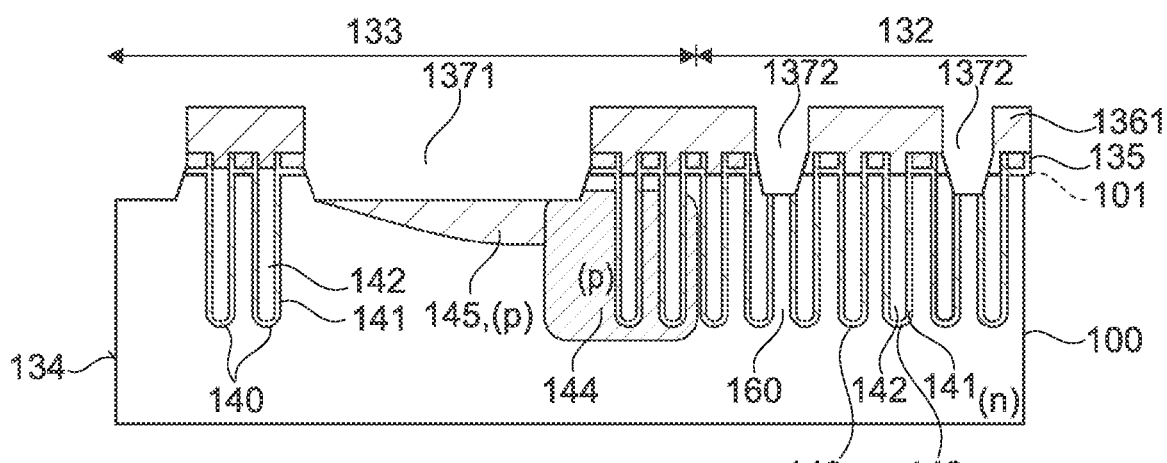

Referring to the schematic cross-sectional view of FIG. 5B, a first resist layer 1361 is formed on the first surface 101 and patterned by photolithography. First trenches 1371 are formed in the termination edge area 133 extending into the semiconductor body 100 from the first surface 101, e.g. by one or more etch processes. Concurrently with the first trenches 1371, second trenches 1372 are formed in the active device area 132 extending into the semiconductor body 100 from the first surface 101. The second trenches 1372 laterally extend through the semiconductor mesa region 160 and into opposite ones of the electrode trench structures 140. A p-doped VLD (variation of lateral doping) region 145 may be formed as lateral field reduction element, e.g. by ion implantation processes into the first trenches using a masking layer with varying sizes of openings. In other embodiments, alternative field reduction concepts may be used such as JTE (junction termination extensions) or p-doped field rings, as known to the expert skilled in the art.

Figure 5C:
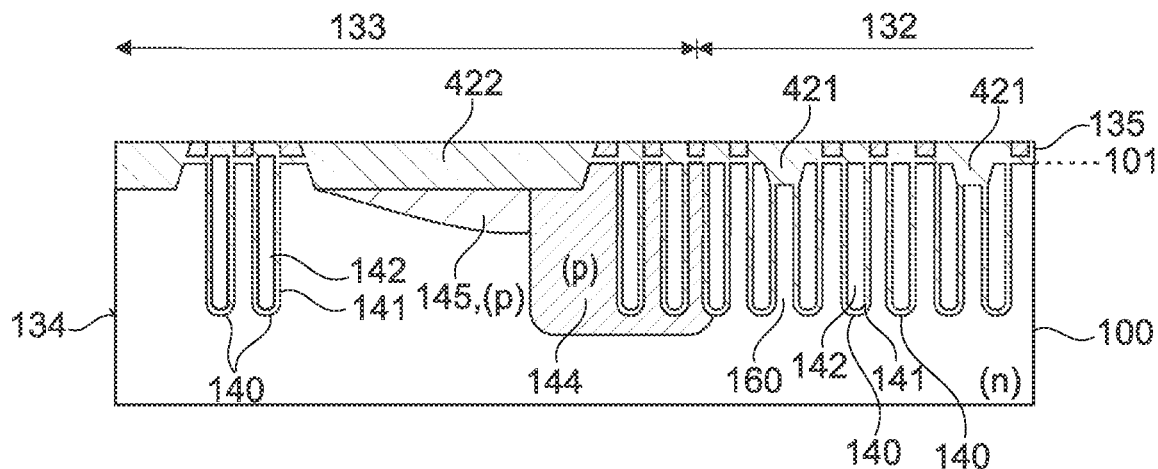

Referring to the schematic cross-sectional view of FIG. 5C, the first resist layer 1361 is removed and first and second isolation trench structures 421, 422 are formed by filling the second and first trenches 1372, 1371 with one or more insulating materials, respectively. The taper of the isolation trenches may be adjusted to facilitate a void-free filling of the isolation trenches.

Figure 5D:
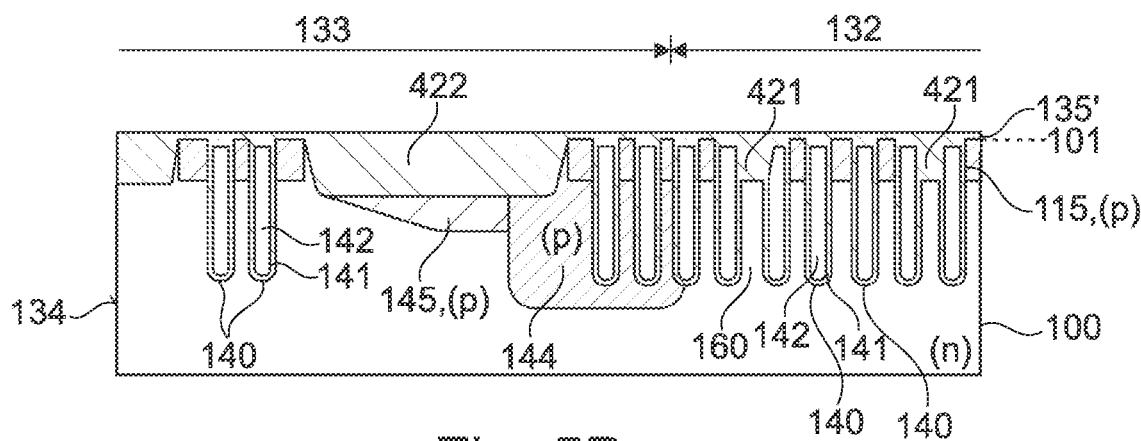

Referring to the schematic cross-sectional view of FIG. 5D, a part of the mask layer 135 is removed, thereby forming a modified mask layer 135'. A body ion implantation process with a subsequent diffusion/activation process may be carried out. Thereby, body regions 115 are formed in the active device area 132.

Figure 5E:
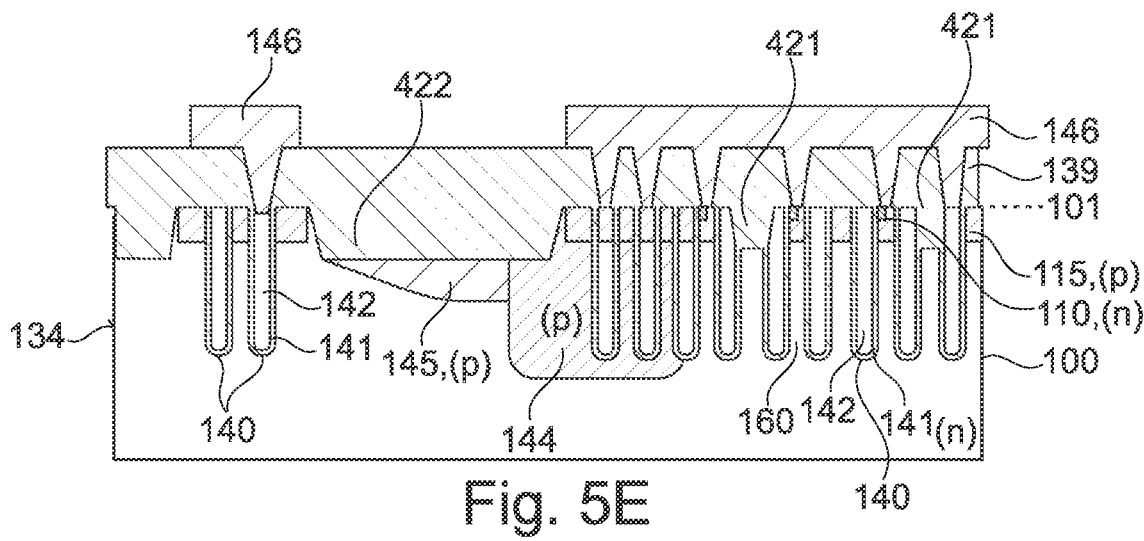

Referring to the schematic cross-sectional view of FIG. 5E, similar to the processes described with reference to FIGS. 4G and 4H, an intermediate dielectric 139, source regions 110 and a contact electrode 146 are formed.

Figure 6:
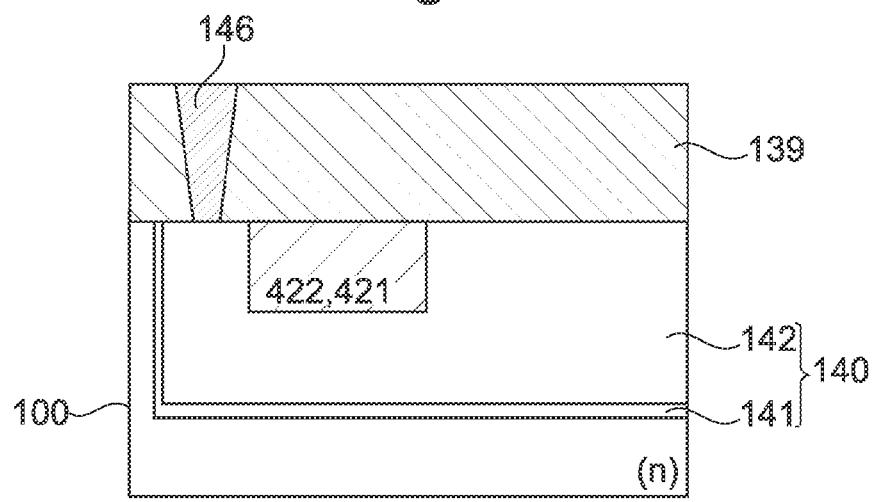
FIG. 6 is a schematic cross-sectional view for illustrating an electrode trench structure having a reduced gate charge due to an isolation trench structure replacing part of a gate electrode.

By modifying a lateral dimension of openings in the second resist 1362 of FIG. 4C in the active device area 132 or in the first resist layer 1361 of FIG. 5B in the active device area 132, the first isolation trench structure 421 may extend through one or more of the semiconductor mesas 160 and through one or more of the electrode trench structures 140, for example. Thereby, a gate charge of passive electrode trench structures such as dummy gate structures may be reduced, for example. This is schematically illustrated in the cross-sectional view of FIG. 6 which is taken along a longitudinal direction of the trench structures 140. Provision of the first and/or second isolation trench structures may thus also allow for a reduction of the gate to source capacitance Cgs, or gate charge, and/or for an improved reliability in view of a reduction in electric field strength, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
    a semiconductor mesa in an active device area, the semiconductor mesa comprising source regions arranged along a longitudinal direction of the semiconductor mesa and separated from one another along the longitudinal direction;
    an electrode trench structure comprising a dielectric and an electrode, the electrode trench structure adjoining a side of the semiconductor mesa; and
    an isolation trench structure filled with one or more insulating materials, the isolation trench structure extending through the semiconductor mesa and into or through the electrode trench structure along a first lateral direction.

2. The power semiconductor device of claim 1, further comprising a second isolation trench structure filled with one or more insulating materials, wherein the second isolation trench structure is arranged in a termination edge area that at least partly surrounds the active device area.

3. The power semiconductor device of claim 1, wherein the semiconductor mesa further comprises a body region, and wherein a vertical level of a bottom side of the isolation trench structure is in a range from a bottom side of the body region to a bottom side of the electrode trench structure.

4. The power semiconductor device of claim 1, wherein a bottom side section of the isolation trench structure extends into or through the electrode trench structure, and wherein the bottom side section adjoins an electrode disposed in the electrode trench structure.

5. The power semiconductor device of claim 1, wherein the electrode trench structure comprises one or more of a gate electrode adjoining a gate dielectric, an electrically floating electrode and an electrode electrically connected to the source regions.

6. The power semiconductor device of claim 1, wherein the isolation trench structure further comprises one or more voids.

7. The power semiconductor device of claim 1, wherein the isolation trench structure is located between two adjacent source regions arranged in the semiconductor mesa.

8. A power semiconductor device, comprising:
    a semiconductor mesa in an active device area, the semiconductor mesa comprising source regions arranged along a longitudinal direction of the semiconductor mesa and separated from one another along the longitudinal direction;

an electrode trench structure comprising a dielectric and an electrode, the electrode trench structure adjoining a side of the semiconductor mesa;

an isolation trench structure filled with one or more insulating materials, the isolation trench structure extending through the semiconductor mesa along a first lateral direction; and a second isolation trench structure filled with one or more insulating materials, the second isolation trench structure being arranged in a termination edge area, wherein the active device area is laterally surrounded by the termination edge area.

9. The power semiconductor device of claim 8, wherein a vertical distance between a bottom side of the isolation trench structure and a top surface level of the semiconductor mesa is greater than a vertical distance between a bottom side of the second isolation trench structure and the top surface level of the semiconductor mesa.

10. The power semiconductor device of claim 8, wherein the active device area is completely laterally surrounded by the second isolation trench structure.

11. The power semiconductor device of claim 8, wherein a vertical distance between a bottom side of the second trench isolation structure and a top surface level of the semiconductor mesa is in a range from 2 µm to 5 µm.

12. The power semiconductor device of claim 8, wherein the isolation trench structure extends into or through the electrode trench structure along the first lateral direction.

13. A method of manufacturing a power semiconductor device, the method comprising:

forming a semiconductor mesa in an active device area;

forming an electrode trench structure comprising a dielectric and an electrode, the electrode trench structure adjoining a side of the semiconductor mesa;

forming an isolation trench structure comprising one or more insulating materials, the isolation trench structure extending through the semiconductor mesa and into or through the electrode trench structure along a first lateral direction; and forming source regions arranged along a longitudinal direction of the semiconductor mesa and separated from one another along the longitudinal direction.

14. The method of claim 13, further comprising:

forming a second isolation trench structure filled with one or more insulating materials, the second isolation trench structure being arranged in a termination edge area that at least party surrounds the active device area.

15. The method of claim 14, wherein forming the isolation trench structure comprises removing a part of an electrode of the electrode trench structure.

16. A method of manufacturing a power semiconductor device, the method comprising:

forming a semiconductor mesa in an active device area;

forming an electrode trench structure comprising a dielectric and an electrode, the electrode trench structure adjoining a side of the semiconductor mesa;

forming an isolation trench structure filled with one or more insulating materials, the isolation trench structure extending through the semiconductor mesa along a first lateral direction;

forming a second isolation trench structure filled with one or more insulating materials, the second isolation trench structure being arranged in an termination edge area, the active device area being laterally surrounded by the termination edge area; and forming source regions arranged along a longitudinal direction of the semiconductor mesa and separated from one another along the longitudinal direction.

17. The method of claim 16, wherein the isolation trench structure and the second isolation trench structure are concurrently formed.

18. The method of claim 16, wherein the isolation trench structure and the second isolation trench structure are formed by separate photolithographic processes.

19. The method of claim 16, wherein at least some of the one or more insulating materials in the isolation trench structure and the second isolation trench structure are concurrently formed in the isolation trench structure and the second isolation trench structure.

20. The method of claim 16, wherein forming the second isolation trench structure comprises etching a trench into a semiconductor body up to a depth in a range from 2 µm to 5 µm.

21. The method of claim 16, wherein the isolation trench structure and the second isolation trench structure are formed after forming the electrode trench structure.

22. The method of claim 21, wherein forming the isolation trench structure comprises removing a part of an electrode of the electrode trench structure.

* * * * *

UNITED STATES PATENT AND TRADEMARK OFFICE
CERTIFICATE OF CORRECTION

PATENT NO. : 11,195,942 B2
APPLICATION NO. : 16/821429
DATED : December 7, 2021
INVENTOR(S) : Thees et al.

Page 1 of 1

It is certified that error appears in the above-identified patent and that said Letters Patent is hereby corrected as shown below:

In the Claims

Column 18, Line 17 (Claim 16) please change "in an" to -- in a --

Signed and Sealed this
First Day of March, 2022

Drew Hirshfeld
*Performing the Functions and Duties of the*
*Under Secretary of Commerce for Intellectual Property and*
*Director of the United States Patent and Trademark Office*